United States Patent
Cheng et al.

[11] Patent Number: 6,083,375
[45] Date of Patent: Jul. 4, 2000

[54] PROCESS FOR PRODUCING CORROSION-RESISTANT TERMINAL METAL PADS FOR THIN FILM PACKAGES

[75] Inventors: Tien-Jen Cheng, Bedford; Ajay P. Giri, Poughkeepsie; Ashwani K. Malhotra, Newburgh; John R. Pennacchia, Wappingers Falls; Eric D. Perfecto; Roy Yu, both of Poughkeepsie, all of N.Y.

[73] Assignee: International Business Machines Corporation, Armonk, N.Y.

[21] Appl. No.: 09/184,169

[22] Filed: Nov. 2, 1998

[51] Int. Cl.[7] .............................. C25D 5/02; C25D 5/10; C25D 5/12; C23C 28/02

[52] U.S. Cl. .................... 205/118; 205/122; 205/170; 205/181; 205/182; 205/184

[58] Field of Search ...................... 205/118, 170, 205/181, 182, 184, 122

[56] References Cited

U.S. PATENT DOCUMENTS

| | | | |
|---|---|---|---|
| 4,394,223 | 7/1983 | Hall | 204/15 |
| 4,626,479 | 12/1986 | Hosoi et al. | 428/663 |
| 5,071,518 | 12/1991 | Pan | 205/122 |
| 5,272,376 | 12/1993 | Ueno | 257/737 |
| 5,326,412 | 7/1994 | Schreiber et al. | 156/150 |
| 5,382,447 | 1/1995 | Kaja et al. | 427/126.6 |
| 5,545,927 | 8/1996 | Farooq et al. | 257/762 |
| 5,858,622 | 1/1999 | Gearhart | 430/315 |

*Primary Examiner*—Kathryn Gorgos
*Assistant Examiner*—Edna Wong
*Attorney, Agent, or Firm*—Ratner & Prestia; Ira D. Blecker

[57] ABSTRACT

A process for producing a terminal metal pad structure electrically interconnecting a package and other components. More particularly, the invention encompasses a process for producing a plurality of corrosion-resistant terminal metal pads. Each pad includes a base pad containing copper which is encapsulated within a series of successively electroplated metal encapsulating films to produce a corrosion-resistant terminal metal pad.

23 Claims, 6 Drawing Sheets

PROCESS FOR PRODUCING CORROSION-RESISTANT TERMINAL METAL PADS FOR THIN FILM PACKAGES

TECHNICAL FIELD

The present invention relates generally to the process for producing high-density, corrosion-resistant, terminal metal pads for semiconductor thin film packages.

BACKGROUND OF THE INVENTION

The increasing input/output (I/O) interconnection density requirements for thin film packages suggest that the current techniques for producing terminal metal pads, such as evaporation through masks and screening, will not be able to meet the tighter ground rules of the advancing technology. This concern is expected to be especially true for land grid array (LGA) type interconnect applications where the typical ground rules for high end packages are in the range of 0.2 to 1.2 millimeters for pad diameters, with a minimal pitch in the range of 0.25 to 1.3 millimeters.

Terminal metal pads require certain characteristics to function as contact points for thin film packages. Typically, a wetting material such as gold (Au) is needed as an outermost metal film to which an electrical connection is provided. Also required is a metal such as nickel (Ni) which serves as a barrier and provides strength. Additionally required as a processing necessity is copper (Cu). Copper is a very ductile material, and acts as a cushion to absorb the residual stresses from a film such as nickel. Unfortunately, the required presence of a film such as copper raises corrosion concerns: copper is susceptible to corrosion when it combines with the moisture present in the air. Because copper is typically exposed at least in the sidewalls of a terminal metal pad, the presence of copper makes the pads susceptible to corrosion.

The currently available processes for producing terminal metal pads may include the following limitations: (1) they are applicable only for pads in a low-density pattern and cannot be scaled to high-density patterns; and (2) they produce multilayer patterns only in the vertical direction, thus leaving exposed the sidewalls of the lower, usually corrosion-suspect metals.

Currently available processes for producing terminal metal pads such as: (a) evaporation through a contact mask; and (b) screening through a mask before ceramic sintering, followed by electroless plating, cannot produce pads in the high-density patterns necessary in modern technology.

To meet the tight packaging requirements required today and in the future, the process of photolithographically patterning a film is the only conventionally known process for producing the high-density pattern of closely spaced pads needed. Using this process, a photolithographic pattern is formed on top of a metal film structure, which may include multiple metal films formed on top of one another. The photolithograph pattern includes a masked region and an exposed region. Next, an etching procedure or series of procedures may be used to remove the film or films in the exposed region and produce a plurality of discrete terminal pads. In this manner, however, the underlying metal films are exposed laterally on the sidewalls of the terminal pads. Therefore, the terminal metal pad may have a structure whereby the films are layered only in the vertical direction and each film is exposed in the lateral direction along the sidewalls. Using this process, when copper is used as an underlying cushioning film, it is included as one of the films exposed in the sidewall, producing a corrosion susceptibility concern in the pads.

The contemporary processes available which can provide sidewall coverage use the electroless plating approach. Traditionally, the process of electroless plating is limited in its versatility; only a limited number of metals can be conveniently deposited using this procedure. Electroless plating is also a relatively expensive, time-consuming process. In addition, the process control for electroless plating is rather complicated due to the relatively narrow process window. Because of poor uniformity characteristics and poor process control, electroless plating is an approach not suited to high-density patterns produce by photolithography.

In the current technology for producing metal terminal pads, the elimination of copper from the terminal pads does not loom as a viable alternative. Without copper, the pads would be susceptible to failure due to cracking of the substrate and/or the more brittle metals that are used to fabricate the pad. Contemporary processes for producing pads include the limitations discussed above. A possible alternative process, for producing corrosion-free pads capable of meeting modern packaging density requirements, would be to deposit a passivation layer on top of the metal pads after the metal pads have been formed. Once deposited, the passivation layer must be patterned and openings must be created to expose only the top of the terminal pads. The shortcomings of this process include the addition and patterning of a separate passivation layer. Such passivation layers require additional processing materials and the additional time and expense associated with forming and patterning the passivation layer. Furthermore, a passivation layer may not be an option for some packaging technologies including those applications for which the terminal pads need to be raised and cannot be "buried."

What is needed is a process which overcomes the shortcomings of contemporary processing technology options, and provides a process for producing tightly packed terminal metal pads capable of meeting the increasing input/output interconnect density requirements. The individual pads produced by this process must be corrosion resistant and must include the strength, wettability, ductility, and cushioning characteristics required to enable the terminal metal pad to provide a reliable connection to an outside component. The process used to form the contact pads will most desirably be inexpensive, fast, reliable, and versatile.

SUMMARY OF THE INVENTION

The present invention addresses the shortcomings of the prior art and provides a process for producing tightly packed terminal metal pads which are corrosion resistant and include the strength, wettability, ductility, and cushioning requirements for modern packaging needs. The present invention also provides the pads and other metal structures such as interconnect lines, formed by this process. The process of the present invention provides an inherent passivation scheme; the copper used in forming the terminal metal pads is not exposed to the environment. A separate passivation layer is not needed, using the process of the present invention, because the copper film is encapsulated within the other metal films which combine to form the terminal metal pad.

The present invention also includes the use of an electroplating process to complete the formation of the terminal pads after a photolithographic process, able to meet modern packaging density needs, has been used to form a pattern of base pads from a seed layer. The electroplating process provides superior uniformity and is faster, less costly, and more versatile than an electroless plating process. The electrical connection supplied through the substrate allows for electrical power to be supplied to the base metal pads which enables an electroplating process to be used to deposit a succession of metal films onto the base metal pad.

The terminal metal pads of the present invention each include a base metal pad and several encapsulating films which provide corrosion protection by covering the base metal pad in both the vertical and horizontal directions. The structure thus produced has a multi-layered pattern in the vertical as well as the horizontal plane (in the plane of the pads). The corrosion-suspect, lower-level metals are completely buried under the corrosion-resistant, higher-level metal materials which are formed as an inherent part of the process.

BRIEF DESCRIPTION OF THE DRAWING

The invention is best understood from the following detailed description when read in conjunction with the accompanying drawing. It is emphasized that, according to common practice, the various features of the drawing are not to scale. On the contrary, the dimensions of the various features are arbitrarily expanded or reduced for clarity. Included in the drawing are the following figures:

FIG. 3 is a cross-sectional view of a seed layer formed on a substrate;

FIG. 4 is a cross-sectional view of an alternate embodiment of a seed layer formed on a substrate;

FIG. 5 is a cross-sectional view showing a base metal pad;

FIG. 6 is a cross-sectional view showing the base metal pad and one encapsulating film;

FIG. 7 is a cross-sectional view showing the base metal pad and two encapsulating films;

FIG. 8 is a cross-sectional view showing a base metal pad with three encapsulating films;

DETAILED DESCRIPTION OF THE PREFERRED EMBODIMENTS

Figure 1:
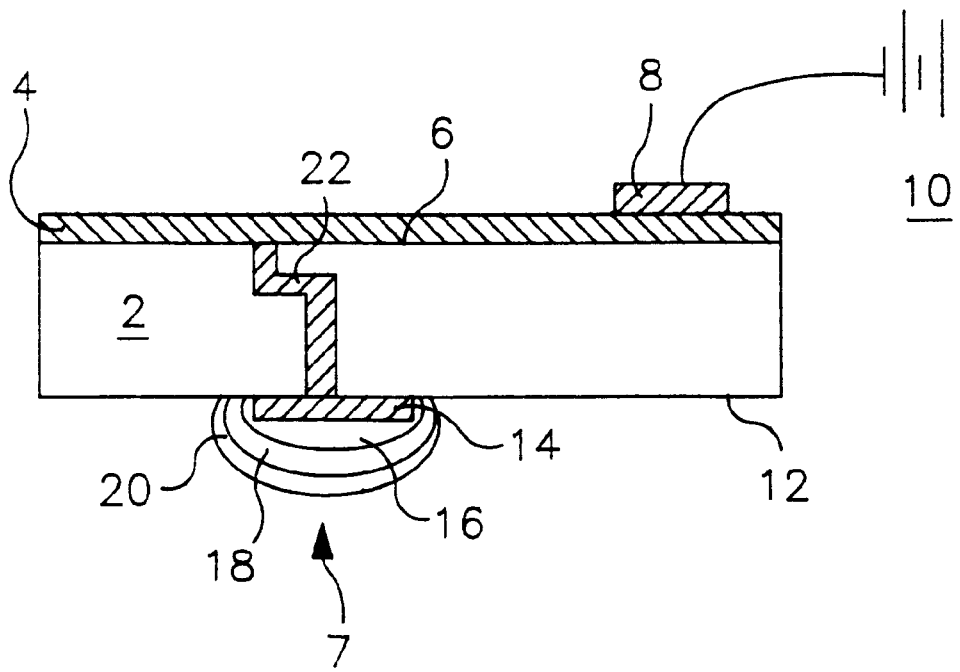
FIG. 1 is a cross-sectional view of a terminal metal pad formed on a substrate connected to a power supply.

FIG. 1 is a cross-sectional view showing an exemplary embodiment of a terminal metal pad 7 of the present invention formed on bottom surface 12 of substrate 2. The substrate 2 may be of ceramic or polymeric materials, and includes two opposed surfaces such as bottom surface 12 and top surface 6. In a preferred embodiment, the substrate 2 may form part of a semiconductor chip package, and the terminal metal pad 7 may be one of a plurality of terminal metal pads formed on the bottom surface 12 of the substrate 2.

FIG. 1 shows an apparatus in which a base metal pad 14 is electrically connected to power supply 10 and conditioned to have films electroplated onto the base metal pad 14. The process of formation of base metal pad 14 will be discussed in conjunction with FIGS. 3–8. On the top surface 6 of substrate 2, a blanket shorting metal film 4 is disposed. The blanket shorting metal film 4 may be formed onto the substrate 2 using any process suitable in the art, and may be composed of any metal film suitable for providing electrical contact. Blanket shorting metal film 4 is connected to power source 10 by a contact 8. A "through via" 22 extends through substrate 2 and provides an electrical connection between the blanket shorting metal film 4 and the base metal pad 14. With the electrical connection provided as shown, a succession of electroplated films (16, 18, and 20) may be formed onto base metal pad 14 by an electroplating process common to the art.

In the exemplary embodiment, the terminal metal pad 7 includes the base metal pad 14 and three successive encapsulating films formed by electroplating. First electroplated encapsulating film 16 covers the metal base pad 14. Second electroplated encapsulating film 18 covers the first encapsulating film 16. A third electroplating encapsulating film 20 covers the second electroplated encapsulating film 18, to form the three encapsulating film structure of the exemplary embodiment.

Although the exemplary embodiment is shown having three successively electroplated films encapsulating the base metal pad 14, it can be seen that additional electroplated films may be used to provide subsequent metal films covering the base metal pad 14 to form the terminal metal pad 7. Alternatively, less than three electroplated films may be used to form the terminal metal pad 7. Any electroplating process suitable in the art may be used to form the succession of encapsulating films onto the terminal metal pad 7.

Figure 2:
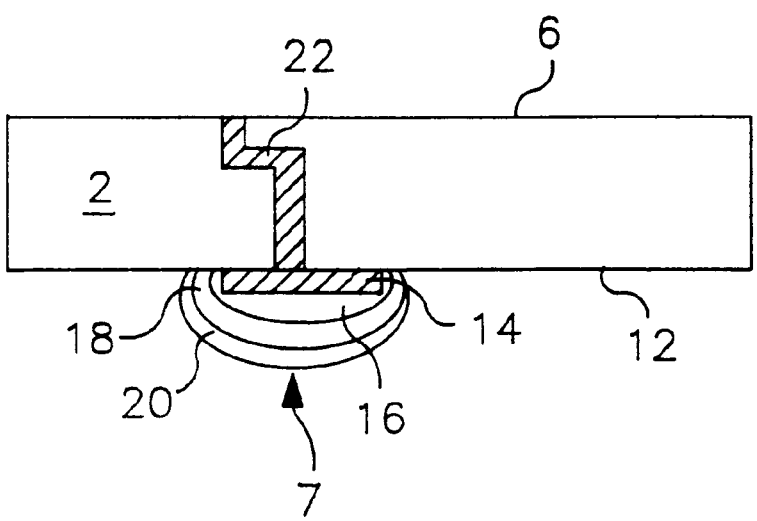
FIG. 2 is a cross-sectional view of a terminal metal pad formed on a substrate.

FIG. 2 is a cross-section showing the structure as in FIG. 1 after the blanket shorting metal film (film 4 in FIG. 1) has been removed from the top surface 6 of substrate 2. In this manner, FIG. 2 shows an exemplary embodiment of terminal metal pad 7 after the electrical connection, required for electroplating, has been removed. Thus, FIG. 2 shows an exemplary embodiment of a terminal metal pad 7 disposed on bottom surface 12 of substrate 2 in its final form. In the preferred embodiment, the individual pad shown would represent one of a plurality of pads formed simultaneously in a high-density pattern on bottom surface 12.

Figure 3:
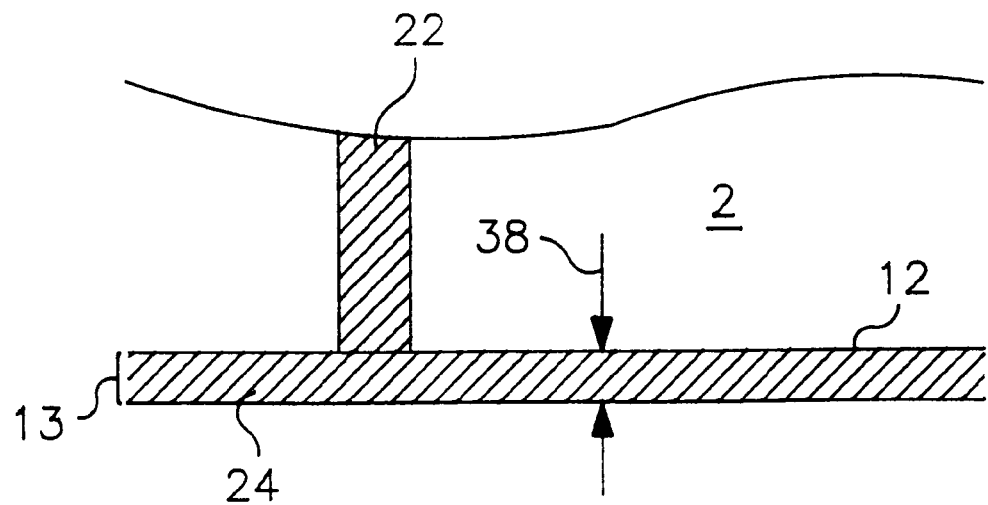
FIGS. 3 through 8 depict the processing sequence used to form a terminal metal pad of the present invention and, more specifically.

FIG. 3 shows a cross-section of the substrate 2 with a seed layer 13 formed on the bottom surface 12. In the exemplary embodiment of FIG. 3, seed layer 13 may be a singular, unitary, monolithic film 24. In an exemplary embodiment, seed layer film 24 may be a metal, such as aluminum (Al), titanium (Ti), chromium (Cr), tungsten (W), molybdenum (Mo), or copper (Cu) and alloys thereof, or any other film suitable in the art. Seed layer film 24 may be formed on bottom surface 12 by any process suitable to the art, such as sputter deposition or evaporation. The thickness 38 of seed layer 13 may be any appropriate thickness required by the chosen application. Through via 22 provides electrical connection as shown in FIG. 3.

Figure 4:
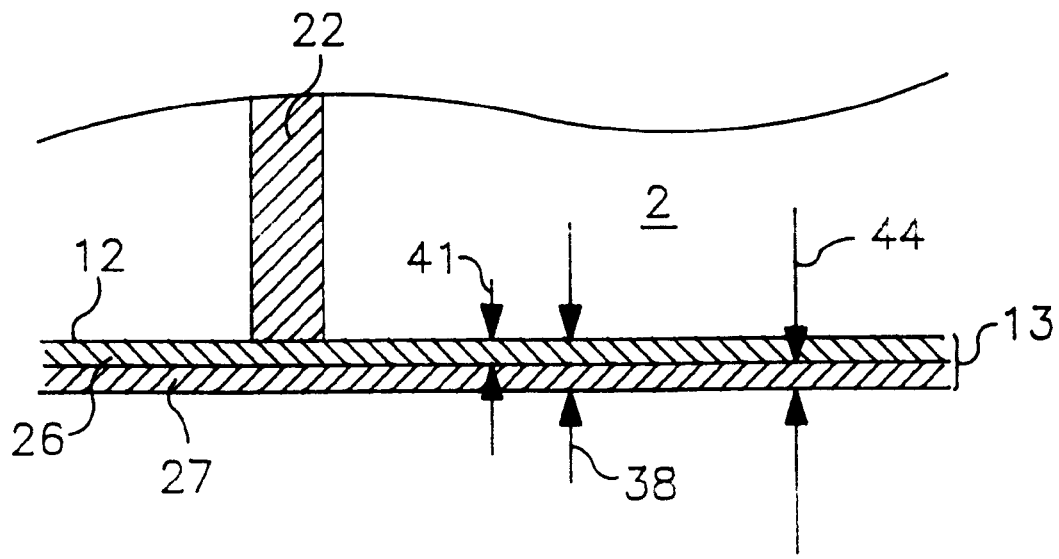

FIG. 4 once again shows the substrate 2 and through via 22 which provides electrical connection as in FIG. 1. FIG. 4 represents a preferred embodiment of the present invention, in which seed layer 13 is formed from two separate films 26 and 27, which combine to form the seed layer 13. The first deposited metal film 26 of the seed layer 13 may be chromium (Cr), but any suitable film may be used. The thickness 41 of film 26 may be on the order of 50–2000 Angstroms.

In the preferred embodiment, as shown in FIG. 4, the second deposited metal film 27 also forms part of the seed layer 13. Second deposited metal film 27 may be copper, but other suitable film materials may be used. The thickness 44 of film 27 may be on the order of 500–50,000 Angstroms. In an alternate embodiment, first deposited metal film 26 may be titanium and second deposited metal film 27 may be tungsten. The total thickness 38 of seed layer 13 is the sum of the thicknesses 44 and 41 of the individual films which combine to form the seed layer. As with the singular film embodiment, the first and second deposited metal films 26 and 27, respectively, may be formed on bottom surface 12 by any process suitable to the art.

Figure 5:
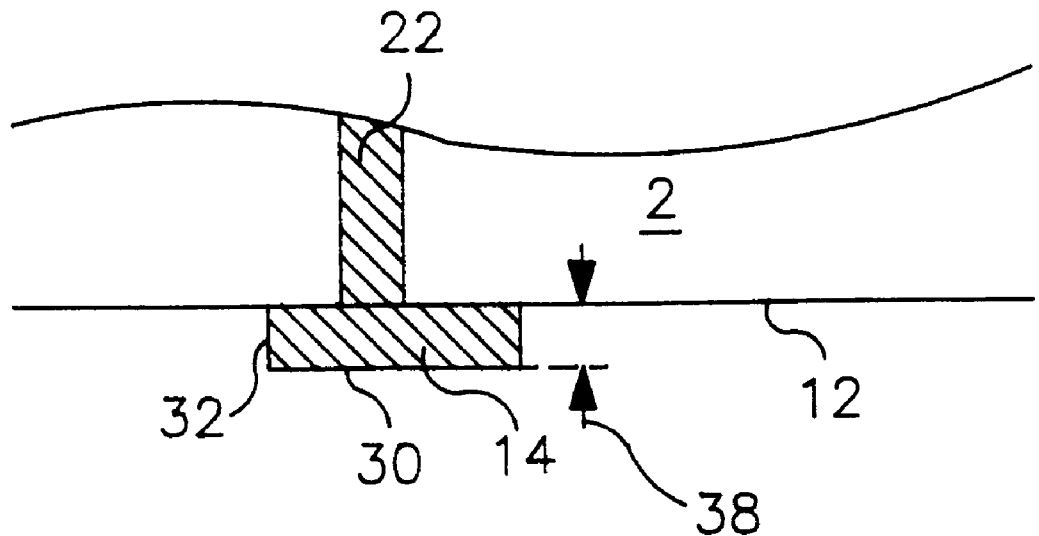

Now turning to FIG. 5, a base metal pad 14 is shown as being formed from a seed layer, such as seed layer 13 of FIG. 3. Base metal pad 14 may be formed by any process capable of providing the high density of pads required in the art. In the preferred embodiment, a photolithographic process may be used to produce tightly spaced pads of small diameter. Using a photolithographic process, a photosensitive film (not shown) is formed on top of the metal seed layer, such as seed layer 13 of FIG. 3, and parts of the film are exposed to light through a photomask. A pattern is formed in the photolithographic film by a developing mechanism, the pattern including an exposed region and a masked area. Next, the exposed portion of the seed layer (such as film 13 in FIG. 3) may be selectively removed by any process suitable to the art such as wet chemical etching, reactive ion etching or physical ion bombardment. In the preferred embodiment, wet chemical etching may be used.

After the formation of the pattern within the seed layer is complete, the photolithographic film is removed from the structure, to produce a plurality of discrete metal base pads, such as base metal pad 14 as in FIG. 5. Base metal pad 14 is formed on bottom surface 12 of substrate 2. Base metal pad 14 includes a surface 30 and sidewalls 32. The height of the base metal pad 14 is substantially the same height as the thickness 38 of the seed layer 13 from which it was formed. The base metal pad 14 is positioned in a pre-determined location on the bottom surface 12 which is over through via 22. Through via 22 provides electrical connection from base metal pad 14, through the substrate 2, and to a power supply 10, as shown in FIG. 1.

Figure 6:
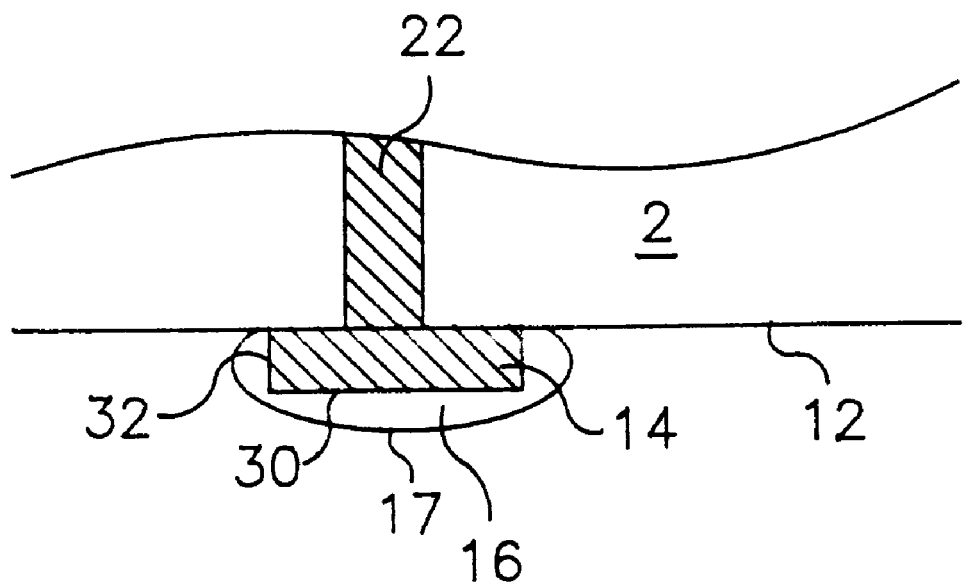

FIG. 6 shows an exemplary embodiment of the present invention after an electroplated first encapsulating film 16 has been formed on the base metal pad 14. The electroplated first encapsulating film 16 may be formed by any electroplating process suitable in the art. Electrical connection to a power supply is provided by through via 22 as shown in FIG. 1. Electroplated first encapsulating film 16 is formed to cover surface 30 of base metal pad 14 as well as sidewalls 32, encapsulating the base metal pad 14. First encapsulating film 16 has an outer surface 17. In the preferred embodiment, first encapsulating film 16 may be a metal of a material determined by product application.

Figure 7:
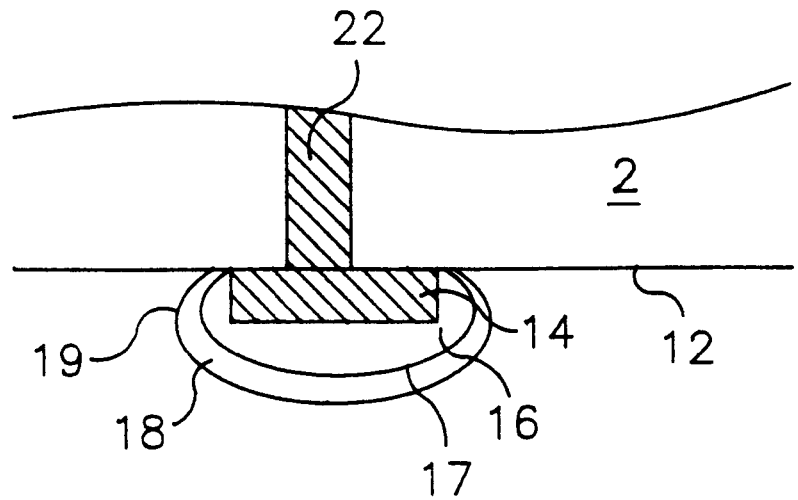

FIG. 7 shows the exemplary embodiment of the present invention after the next step in the process sequence. Second encapsulating film 18 is formed over outer surface 17 of first encapsulating film 16. Second encapsulating film 18 has an outer surface 19. As in the previous process step, any process of electroplating suitable in the art may be used to form second encapsulating film 18. As with the first encapsulating film 16, the second encapsulating film 18 may be a metal of a material determined by product application.

Figure 8:
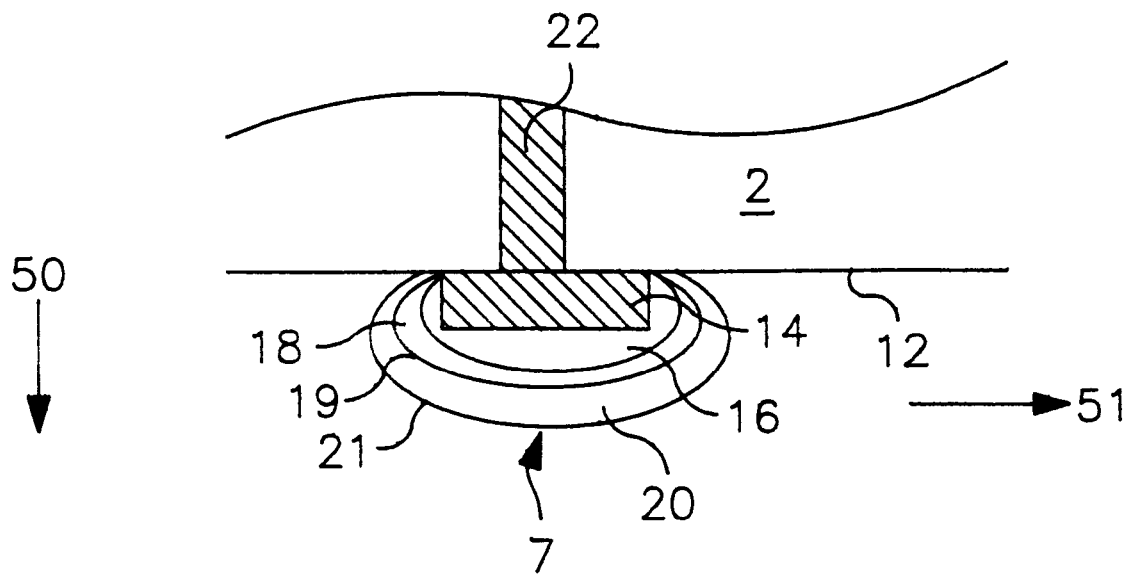

FIG. 8 shows the exemplary embodiment of the terminal metal pad 7 of the present invention after a third encapsulating film 20 has been formed over the outer surface 19 of second encapsulating film 18. Third encapsulating film 20 has an outer surface 21. As with the previous electroplated films, third encapsulating film 20 may be formed by any electroplating procedure suitable to the art. FIG. 8 shows a completed structure of an exemplary embodiment of the present invention having three encapsulating films. In the exemplary embodiment formed of three encapsulating films, the third, outermost film may be is gold. It can be seen that the structure includes three layers of encapsulating films in both the vertical direction 50 and the horizontal direction 51. It can also be seen that base metal pad 14 is completely encapsulated by the encapsulating films. It can be further seen that each encapsulating film is completely encapsulated by the subsequently deposited encapsulating film which covers it.

In the embodiment of the three encapsulating film structure as shown, a preferred embodiment may include a first encapsulating film being copper, a second encapsulating film being nickel, and a third and outermost encapsulating film being gold. In another embodiment, the outermost film may be palladium (Pd). It can be seen by one skilled in the art that the three encapsulating film embodiment of the present invention may use different materials in different combinations to form the three-film structure.

The present invention also contemplates alternate embodiments which incorporate additional electroplated films, or less than three electroplated films. The terminal metal pad 7, which includes a base metal pad 14, may have any number of subsequently electroplated films covering it. In addition, the films used for each encapsulating layer may be different films as determined by the application. In the preferred embodiment of any structure, the outermost film may be gold or palladium, but other films may be used depending on the connection required.

Figure 9:
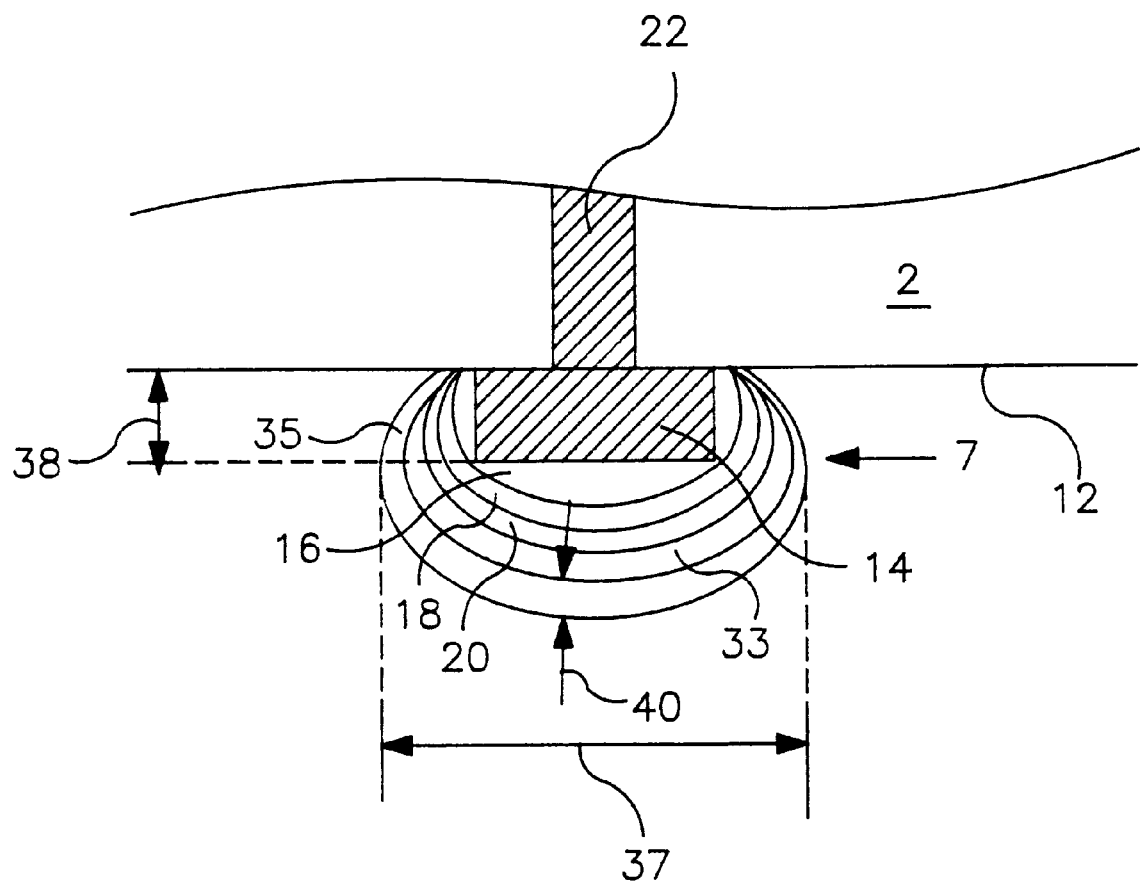
FIG. 9 is a cross-sectional view of an alternate embodiment of the present invention having five encapsulating films.

FIG. 9 shows a cross-section of an alternate embodiment of the present invention having five encapsulating films. In this alternate embodiment, base metal pad 14 is formed on bottom surface 12 of substrate 2. Through via 22 provides electrical connection as shown in FIG. 1, to an electrical power supply which enables the electroplated deposition of subsequent films to cover base pad 14. In this alternate embodiment, first encapsulating film 16 covers base metal pad 14, and second encapsulating film 18 covers first encapsulating film 16. Likewise, third encapsulating film 20 covers second encapsulating film 18, and fourth encapsulating film 33 covers third encapsulating film 20. The outer encapsulating film 35 covers the fourth encapsulating film 33.

In the embodiment using a five encapsulating film structure, the preferred sequence of deposited films may be copper, nickel, gold, nickel, and gold. It can be seen by one skilled in the art that other metals including chromium (Cr) and cobalt (Co) may be used, and that they may be used in various sequences. In the preferred embodiment, the outermost encapsulating film 35 may be gold or palladium.

The terminal metal pad 7 shown in FIG. 9 is typically formed as one of a plurality of similarly formed discrete terminal metal pads (not shown), all formed simultaneously on bottom surface 12 of substrate 2 by the process described in conjunction with FIGS. 3 through 8. Each terminal metal pad 7 may include a base metal pad thickness 38 and a diameter 37. In the preferred embodiment, the diameter 37 may be on the order of 0.5 millimeters. The spacing (not shown) between adjacent terminal metal pads may be on the order of 0.2 to 0.3 millimeters in the preferred embodiment, forming a tightly packed, dense packaging structure. Also in the preferred embodiment, the film thickness 40 of an electroplated film may be on the order of 100–50,000 Angstroms.

After the succession of electroplated films have been formed in over the base metal pad 14, the blanket shorting layer metal film (film 4 as in FIG. 1) may be removed. Electrical connection is no longer required because subsequent electroplating is not needed. Any process for removing such a metal film suitable in the art may be used. Alternatively, the shorting layer metal film may be left on the top surface 6 of the substrate 2, and could be used for subsequent thin film processing.

Figure 10:
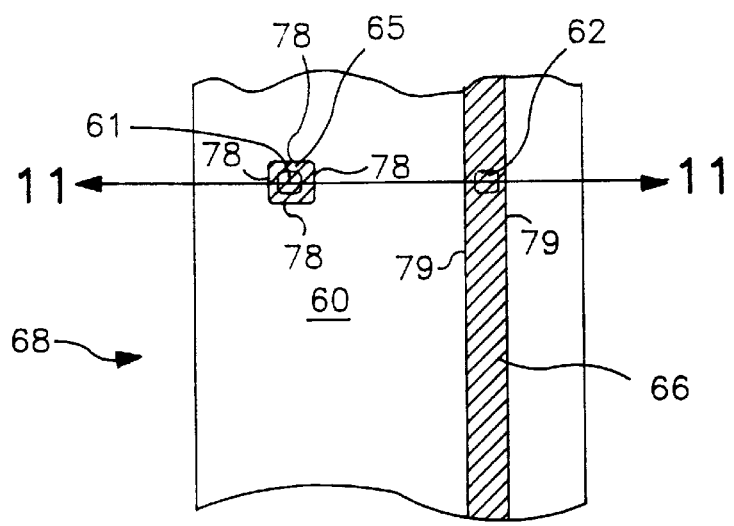
FIG. 10 is a plan view of two exemplary embodiments of the present invention formed on a substrate.

FIG. 10 is a plan view showing exemplary embodiments of two different structures formed by the present invention. On surface 60 of substrate 68, both a substantially circular terminal metal pad 65 and an interconnect metal line 66 are formed. In an alternate embodiment, the terminal metal pad 65 may be shaped differently. For example, the terminal metal pad 65 may be substantially rectangular. Each structure is connected through the substrate 68 by means of a via. Terminal metal pad 65 is connected through the substrate 68 by via 61 and interconnect metal line 66 is connected through the substrate 68 by via 62. The two different exemplary embodiments (structures 65 and 66) of the present invention are formed simultaneously, both through the formation of the metal seed structure, and the subsequent electroplating steps. In the embodiment shown in FIG. 10, the two different structures 65 and 66 are each defined during the patterning step which forms both the terminal metal pad structure 65 and the interconnect metal line structure 66, simultaneously, using a single photomask. With respect to substantially circular terminal metal pad 65, the electroplated encapsulating metal films (not shown) will be formed to cover the sidewall 78, which extends circumferentially around the terminal metal pad 65. With respect to interconnect metal line 66, the electroplated encapsulating metal films (not shown) will be formed to cover the two opposed sidewalls 79 as shown.

Figure 11:
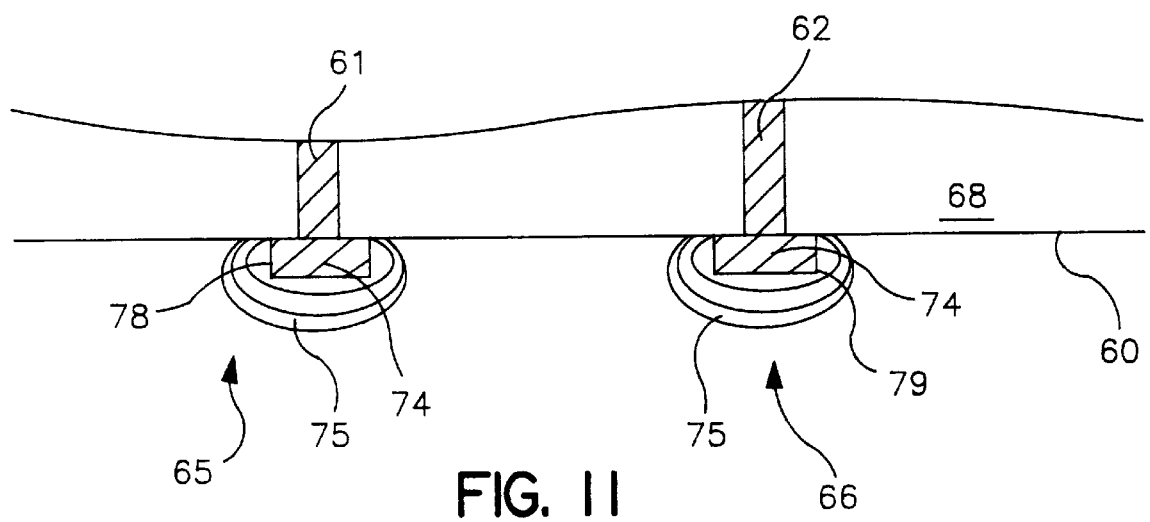
FIG. 11 is a cross-sectional view taken along line 11—11 of FIG. 10 after the electroplated encapsulating films have been formed showing two exemplary embodiments of the present invention.

FIG. 11 is a cross-sectional view taken along line 11—11 of FIG. 10 and after the electroplated encapsulating films have been formed. FIG. 11 shows that the cross-sections of structures 65 and 66, are substantially similar. Both structures 65 and 66 are formed on surface 60 of substrate 68. Each is connected through the substrate 68 through a via: structure 65 through via 61 and structure 66 through via 62. Each structure includes a metal seed structure 74 and a plurality of electroplated encapsulating metal films 75 formed over the metal seed structure 74. For each structure, the cross-section shows two opposed sidewalls (sidewalls 78 for structure 65 and sidewalls 79 for structure 66). In each case, the plurality of electroplated encapsulating metal films 75 substantially covers the sidewalls shown in the cross-section.

In alternate embodiments not shown, the substrate 68 may include a plurality of similar or dissimilar structures, including, but not limited to the pad structure and line structure shown in FIGS. 10 and 11. The structures are formed simultaneously according to the process of the present invention. The structures differ because the patterns formed within the metal seed layer differ, but have similar cross-sections, each including a plurality of electroplated encapsulating metal films formed over a metal seed structure, as described in conjunction with FIGS. 10 and 11 above.

It should be understood that the foregoing description of preferred embodiments has been presented for the purpose of illustrating and describing the main points and concepts of the present invention. The present invention is not limited, however, to these embodiments. The geometry of the individual terminal metal pads and the spacing between the terminal metal pads may be varied according to packaging need. The number of electroplated films may also vary depending on the application. Likewise, the films used to form the terminal metal films may vary according to the application. The geometry of an individual terminal metal pad, with a fixed base metal pad, will vary depending on how many electroplated films are used to encapsulate the base metal pad. The pattern formed of terminal metal pads and the density within the pattern may also vary. Alternate embodiments may include a different number of films to form the terminal metal pad. The thicknesses of the films which combine to form the terminal pad may also vary.

As described above, the process description and structures produced are very suitable for LGA-type interconnects. Other applications where the proposed invention may be beneficial include: providing capped connections with differential heights for special interconnects; producing elastically compliant capping for semiconductor and other industries (such as for self-lubricated soft coatings on gears); and producing hard, wear-resistant cappings for tribological applications.

What is claimed:

1. A process for forming a terminal metal structure on a substrate comprising the steps of:
    a) providing a substrate having a first surface and an opposed second surface, said first surface electrically connected to said second surface;
    b) forming a blanket metal film on said first surface;
    c) forming a metal base layer on said second surface;
    d) forming a metal seed structure from said metal base layer, said metal seed structure having sidewalls and a top surface and being electrically connected to said blanket metal film;
    e) providing electrical connection between an electrical power supply and said blanket metal film, and therefore said metal seed structure;
    f) electroplating a first encapsulating metal film covering said sidewalls and said top surface of said metal seed structure; and
    g) electroplating a second encapsulating metal film covering said first encapsulating metal film.

2. The process as in claim 1, wherein said first surface and said second surface are electrically connected by a conductive wire extending from said first surface through said substrate and abutting said second surface at a predetermined location.

3. A process for simultaneously forming a plurality of terminal metal structures on a substrate, each terminal structure formed according to the process as in claim 2.

4. The process as in claim 2, wherein said step d) comprises:
    d1) coating said metal base layer with a photo-sensitive film;
    d2) forming a pattern within said photo-sensitive film using photolithography, said pattern including a mask section disposed over said predetermined location and covering said metal base layer;
    d3) selectively removing the portions of said metal base layer not covered by said mask section; and
    d4) removing said photo-sensitive film.

5. The process as in claim 1, wherein said metal seed structure comprises a metal pad and said terminal metal structure therefore comprises a terminal metal pad.

6. A process for forming a plurality of terminal metal pads on a substrate, each terminal pad formed according to the process as in claim 5.

7. The process as in claim 1, wherein said metal base layer includes tungsten.

8. The process as in claim 1, wherein said metal base layer includes molybdenum.

9. The process as in claim 1, wherein said metal base layer includes copper.

10. The process as in claim 1, further comprising the step h) of removing said blanket metal film.

11. The process as in claim 1, wherein said step of forming a metal base layer comprises:
   c1) forming a first metal base film on said second surface; and
   c2) forming a second metal base film on said first metal base film.

12. The process as in claim 11, wherein said first metal base film comprises titanium and said second metal base film comprises tungsten.

13. The process as in claim 11, wherein said first metal base film comprises cobalt and said second metal base film comprises copper.

14. The process as in claim 1, wherein said second encapsulating metal film comprises one of gold or palladium.

15. The process as in claim 1, further comprising the step h) of electroplating a third encapsulating film over said second encapsulating metal film, said third encapsulating metal film covering said second encapsulating metal film.

16. The process as in claim 15, wherein said third encapsulating metal film comprises one of gold or palladium.

17. The process as in claim 15, wherein said first encapsulating film comprises cobalt and said second encapsulating film comprises nickel.

18. The process as in claim 15, further comprising the step i) of electroplating a fourth encapsulating metal film over said third encapsulating metal film, said fourth encapsulating metal film covering said third encapsulating metal film.

19. The process as in claim 18, further comprising the step j) of electroplating a fifth encapsulating metal film over said fourth encapsulating metal film, said fifth encapsulating metal film covering said fourth encapsulating metal film.

20. The process as in claim 19, wherein said fifth encapsulating metal film comprises one of gold or palladium.

21. The process as in claim 19, wherein said first encapsulating metal film comprises copper, said second encapsulating metal film comprises nickel, said third encapsulating metal film comprises gold, said fourth encapsulating metal film comprises nickel, and said fifth encapsulating metal film comprises gold.

22. The process as in claim 19, further comprising the step k) of electroplating at least one encapsulating metal film over said fifth encapsulating metal film, said at least one encapsulating metal film at least indirectly covering said fifth encapsulating metal film.

23. The process as in claim 18, wherein said fourth encapsulating metal film comprises one of gold or palladium.

* * * * *